（12） United States Patent
Sun et al.

(10) Patent No.: US 6,878,614 B2
(45) Date of Patent: Apr. 12, 2005

(54) METHODS OF FORMING INTEGRATED CIRCUIT DEVICES INCLUDING FUSE WIRES HAVING REDUCED CROSS-SECTIONAL AREAS AND RELATED STRUCTURES

(75) Inventors: Ho-won Sun, Kyungki-do (KR); Kwang-kyu Bang, Kyungki-do (KR); In-ho Nam, Kyungki-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 21 days.

(21) Appl. No.: 10/337,540

(22) Filed: Jan. 7, 2003

(65) Prior Publication Data

US 2003/0139028 A1 Jul. 24, 2003

(30) Foreign Application Priority Data

Jan. 23, 2002 (KR) ................................. 10-2002-0003930

(51) Int. Cl.⁷ ............................................. H01L 21/44
(52) U.S. Cl. ..................... 438/601; 438/598; 438/467; 438/433; 438/333; 438/281; 438/215; 438/132; 257/50; 257/209; 257/529; 257/530; 257/702
(58) Field of Search ................................ 438/598–601, 438/467, 433, 333, 281, 215, 132; 257/50, 209, 529–30, 702

(56) References Cited

U.S. PATENT DOCUMENTS

| 4,536,949 | A | * | 8/1985 | Takayama et al. .......... 438/601 |
| 5,469,981 | A | * | 11/1995 | Srikrishnan et al. .......... 216/13 |
| 5,770,993 | A | * | 6/1998 | Miyazawa et al. .......... 337/160 |
| 5,879,966 | A | * | 3/1999 | Lee et al. .................... 438/132 |
| 6,461,893 | B2 | * | 10/2002 | Hyoudo et al. ............. 438/106 |
| 6,495,901 | B2 | * | 12/2002 | Brintzinger et al. ........ 257/529 |
| 2003/0109125 | A1 | * | 6/2003 | Jou ............................ 438/601 |
| 2003/0111740 | A1 | * | 6/2003 | Wang ......................... 257/784 |
| 2003/0139028 | A1 | * | 7/2003 | Sun et al. ................... 438/601 |
| 2003/0141568 | A1 | * | 7/2003 | Sato et al. .................. 257/529 |

FOREIGN PATENT DOCUMENTS

| JP | 59124741 | 7/1984 | |
| JP | 2000-332114 | * 11/2000 | ........... H01L/21/82 |

OTHER PUBLICATIONS

Notice to Submit Response in Korean Application No. 10–2002–0003930, Issued Nov. 28, 2003.
English Translation of Notice to Submit Response in Korean Application No. 10–2002–0003930, Issued Nov. 28, 2003.

* cited by examiner

*Primary Examiner*—Matthew Smith
*Assistant Examiner*—Granvill D. Lee, Jr.
(74) *Attorney, Agent, or Firm*—Myers Bigel Sibley & Sajovec

(57) ABSTRACT

A method of forming an integrated circuit device can include forming a plurality of fuse wires on an integrated circuit substrate, and forming an insulating layer on the integrated circuit substrate and on the plurality of fuse wires so that the fuse wires are between the integrated circuit substrate and the insulating layer. A plurality of fuse cutting holes can be formed in the insulating layer wherein each of the fuse cutting holes exposes a target spot on a respective one of the fuse wires, and a cross-sectional area of the fuse wires can be reduced at the exposed target spots. Related structures are also discussed.

44 Claims, 11 Drawing Sheets

METHODS OF FORMING INTEGRATED CIRCUIT DEVICES INCLUDING FUSE WIRES HAVING REDUCED CROSS-SECTIONAL AREAS AND RELATED STRUCTURES

RELATED APPLICATIONS

This application claims the benefit of Korean Patent Application No. 2002-0003930, filed Jan. 23, 2002, the disclosure of which is hereby incorporated herein by reference in its entirety as if set forth fully herein.

BACKGROUND OF THE INVENTION

1. Field of the Invention

The present invention relates to semiconductor devices, and more particularly, to methods of forming fuses for semiconductor devices and related structures.

2. Description of the Related Art

Memory capacities of semiconductor memory devices are continuously increased by reducing sizes of individual elements therein. As the density of the elements per unit area increases by reducing sizes of elements, defect rates of elements may increase. An integrated circuit chip including a single defective element may be considered a failure resulting in reduced yield.

To increase yields, a redundant (or spare) circuit can be provided in a chip to replace a defective element. The replacement of a redundant circuit for an inoperative circuit can be referred to as a repair operation. In addition, a trimming operation of varying characteristics of some circuits for application may be performed.

Repair and/or trimming operations can be performed by cutting portions of wires with a laser. The wires cut with the laser can be referred to as fuses. A region having a plurality of fuses can be referred to as a fuse region. Because cut fuses can block current flow, a high conductive state can be converted into a low conductive state, for example, a non-conductive state.

FIG. 1 illustrates a fuse region 10 having a plurality of fuses 2, 4, 6, and 8. The plurality of fuses 2, 4, 6, and 8 shown in FIG. 1 are in an uncut state, namely, in the conductive state.

Referring to FIG. 2, the fuse 4 is cut by irradiating a laser thereon so as to block the current flowing through the fuse 4. The cut fuse 4 and adjacent fuses 2 and 6 may be relatively near each other in considering the laser wavelength and the spot size. Accordingly, adjacent fuses may be accidentally cut in a fuse cutting operation. As a result, a defect may be introduced into the semiconductor device, a link to adjacent regions may be generated, and/or severe physical damage may occur in adjacent fuses. In addition, a crack 11 caused by stress from laser energy may develop from the fuse 4 so that adjacent fuses are damaged.

Methods for protecting adjacent fuses in a fuse cutting operation have been developed. A sufficient distance can be maintained between fuses so that excessive cracks and/or damage on the adjacent elements and/or on adjacent fuses is reduced. However, as semiconductor devices become more highly integrated, dense pitches may be required between the wires. Accordingly, a crack blocking structure may be interposed between fuses to reduce distance of the pitch or a fuse pattern may be varied to form a highly reliable fuse region.

FIG. 3 illustrates a fuse region 20 formed of a plurality of fuses 12, 14, and 16. Additional structures 23 and 25 are arranged between the fuses in the fuse region 20. The additional structures 23 and 25 are formed of a barrier material, such as tungsten or molybdenum, operating as a crack stop portion in cutting the fuse 14 with the laser. As a result, a crack 21 developed from the fuse 14 may be blocked by the additional structures 23 and 25.

However, even though this method may reduce a gap between the pitches to a certain degree, a gap between pitches may be increased by adding the additional structures and an increase of chip area may result. Moreover, the crack stop structures introduced between the fuses may be inoperative in a dense pitch, because the crack stop structures themselves may be ablated by the laser, thereby damaging adjacent fuses or circuit elements.

In the case of a DRAM, bit lines or word lines may be used as fuses. In semiconductor devices other than the memory devices, other wires may be used as fuses. Recently, metal wires have been used as fuses in DRAMs. When metal wires are used as fuses, thicknesses and widths of the metal wires may be relatively greater than those of the bit lines or the word lines.

SUMMARY OF THE INVENTION

According to embodiments of the present invention, methods of forming integrated circuit devices can include reducing cross-sectional areas of fuse wires. More particularly, a plurality of fuse wires can be formed on an integrated circuit substrate, and an insulating layer can be formed on the integrated circuit substrate and on the plurality of fuse wires so that the fuse wires are between the integrated circuit substrate and the insulating layer. A plurality of fuse cutting holes can be formed in the insulating layer wherein each of the fuse cutting holes exposes a target spot on a respective one of the fuse wires, and a cross-sectional area of fuse wires can be reduced at the exposed target spots. After reducing cross-sectional areas, one of the plurality of fuse wires can then be cut at the respective exposed target spot.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIGS. 4A, 5A, 6A, and 7A are plan views illustrating steps of forming fuses in semiconductor devices and related structures according to first embodiments of the present invention. FIGS. 4B, 5B, 6B, and 7B are sectional views along lines b–b' shown in FIGS. 4A, 5A, 6A, and 7A, respectively.

Figure 1:
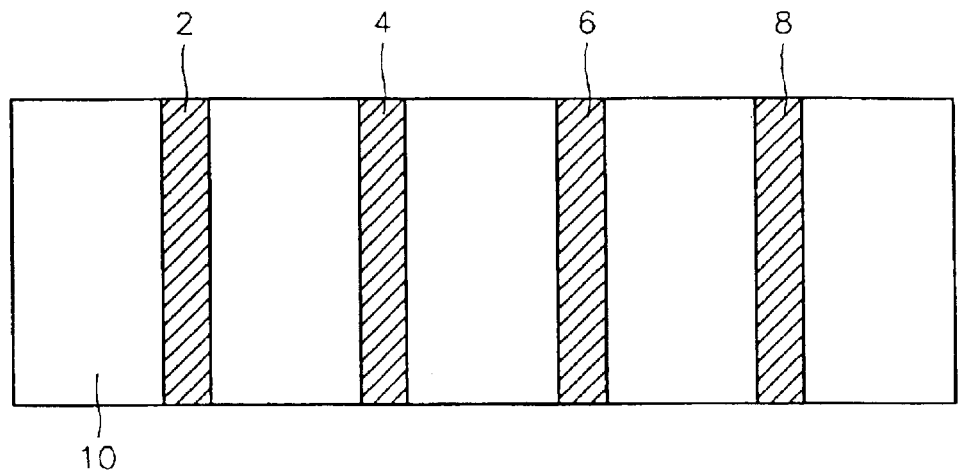
FIGS. 1 through 3 are plan views illustrating conventional fuse regions of semiconductor devices.
Figure 2:
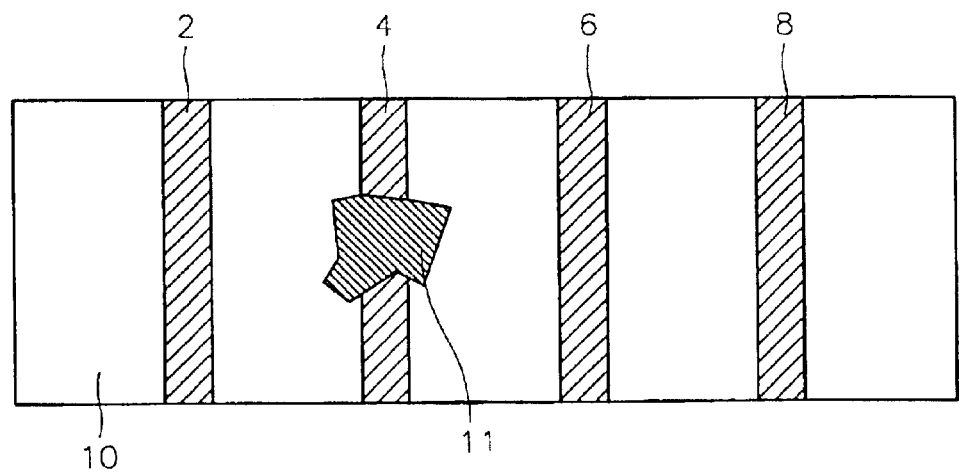
Figure 3:
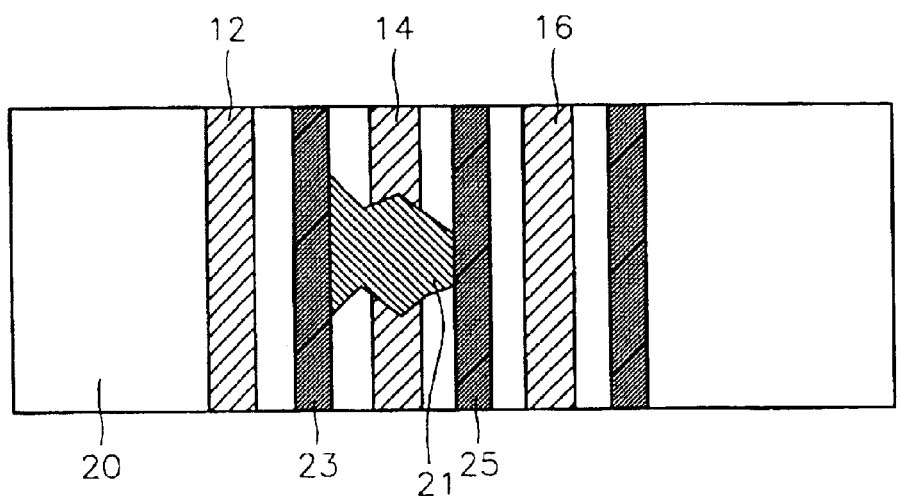
Figure 4A:
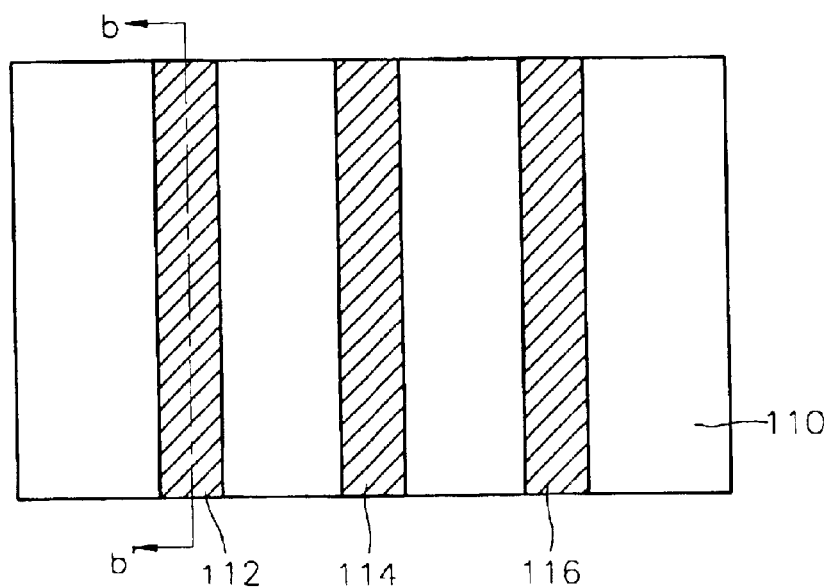
FIGS. 4A, 5A, 6A, and 7A are plan views illustrating steps of forming fuses in semiconductor devices and related structures according to embodiments of the present invention.
Figure 4B:
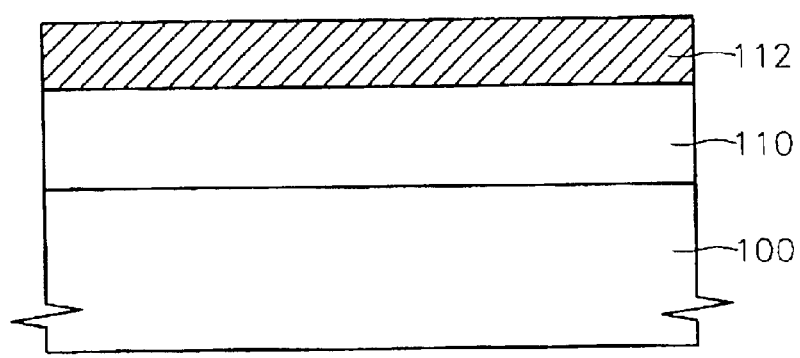
FIGS. 4B, 5B, 6B, and 7B are sectional views along respective lines b–b', illustrating steps of forming fuses in semiconductor devices and related structures according to the respective plan views of FIGS. 4A, 5A, 6A, and 7A.

Referring to FIGS. 4A and 4B, an interlevel insulating layer 110 is formed on a substrate 100 to isolate the substrate 100 from a structure to be formed on the interlevel insulating layer 110. The interlevel insulating layer 110 may be formed of boron phosphorous silicate glass (BPSG), phosphorous silicate glass (PSG), spin on glass (SOG), tetra ethyl ortho silicate (TEOS), and/or undoped silicate glass (USG) layers, a layer formed of one material selected from the above materials, and/or by depositing an insulating material such as silicon nitride.

Lower wires 112, 114, and 116 are formed on the interlevel insulating layer 110 to be used as fuses. For example, a layer of a metal such as tungsten, aluminum, and/or copper can be deposited on the entire surface of the interlevel insulating layer 110. In this case, the metal can be deposited by a chemical vapor deposition (CVD) method and/or by a physical vapor deposition (PVD) method. The deposited metal can be patterned by a photo etching technique to provide line-type lower wires 112, 114, and 116 as shown in FIG. 4A. In the case of using metal, it may be preferable to include a barrier metal layer under the metal layer. The lower wires 112, 114, and 116 can be formed in various shapes other than line shape, if desired.

Figure 5A:
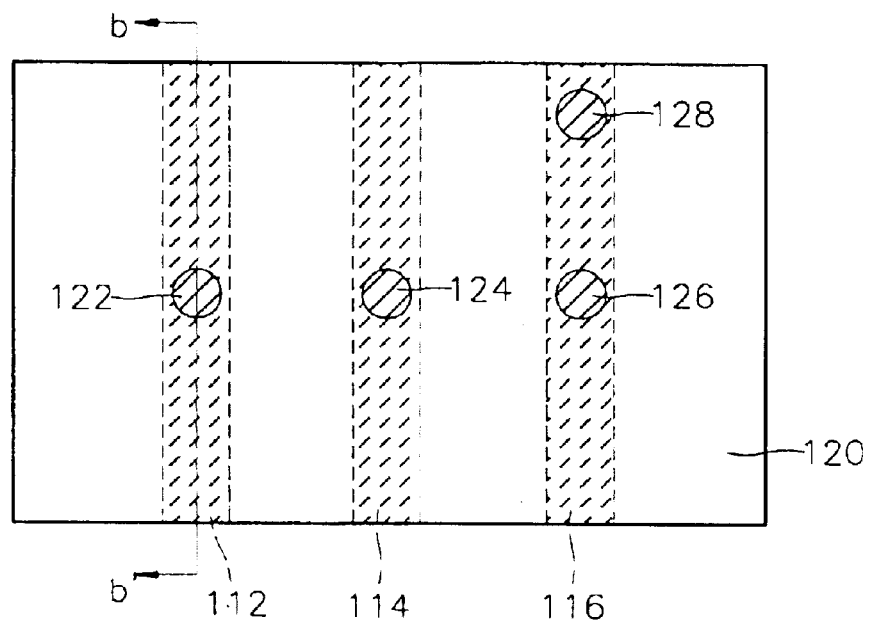
Figure 5B:
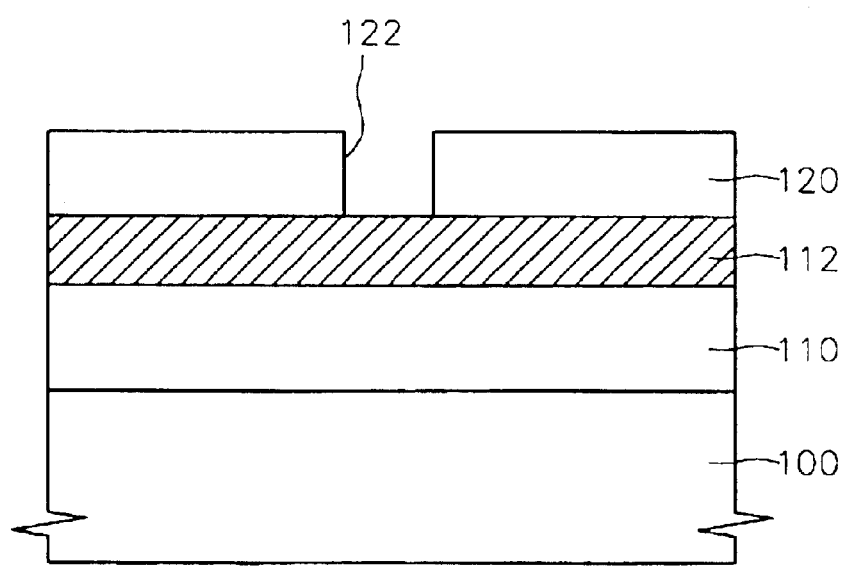

Referring to FIGS. 5A and 5B, an insulating layer 120 can be formed on the substrate 100 including the lower wires 112, 114, and 116. As in the case for the interlevel insulating layer 110, the insulating layer 120 can be formed of BPSG, PSG, SOG, TEOS, and/or USG layers, of a layer formed of one material selected from the above materials, and/or by depositing another insulating material, such as silicon nitride. If needed, a planarization operation, for example a chemical mechanical polishing (CMP), may be performed after forming the insulating layer 120. In FIGS. 5A and 5B, each of the interlevel insulating layer 110 and the insulating layer 120 is shown as one layer for convenience; however, the interlevel insulating layer 110 and the insulating layer 120 can be formed of multi layers of different materials. This may also apply to second and third embodiments of the present invention.

The insulating layer 120 is etched to form holes 122, 124, and 126 on the lower wires 112, 114, and 116 for centering the target spots upon which a laser will hit. One or more via holes 128 can be formed for electrically connecting one or more lower wires 112, 114, and 116 with upper wires to be formed on the insulating layer 120. The shape, number, and layout of the holes 122, 124, and 126 and the via hole 128 can be determined in considering the pitch, structure, and layout of the lower wires 112, 114, and 116. As shown in FIGS. 5A and 5B, the holes 122, 124, and 126 and the via hole 128 can have a cylindrical shape.

Figure 6A:
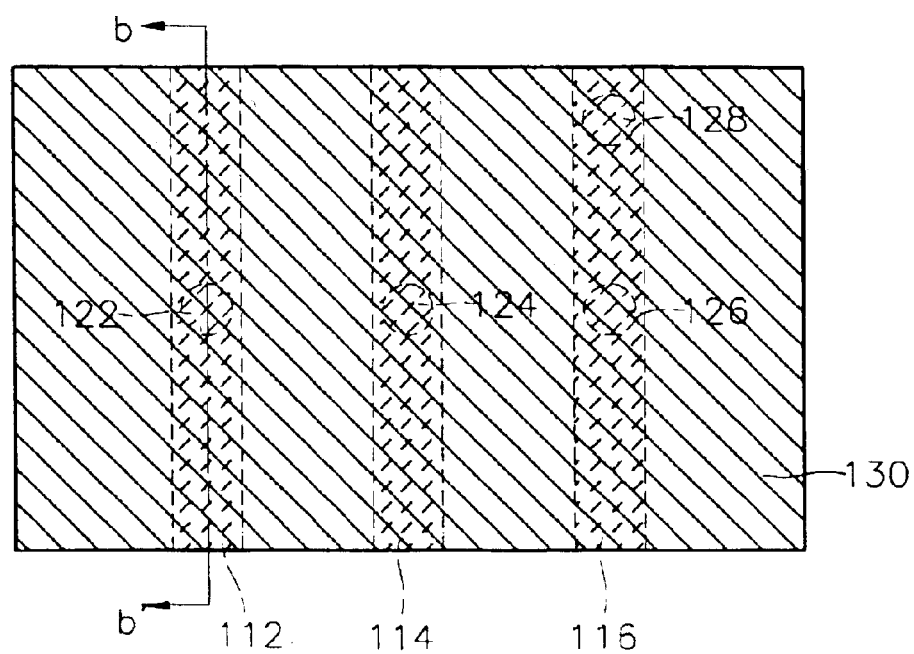
Figure 6B:
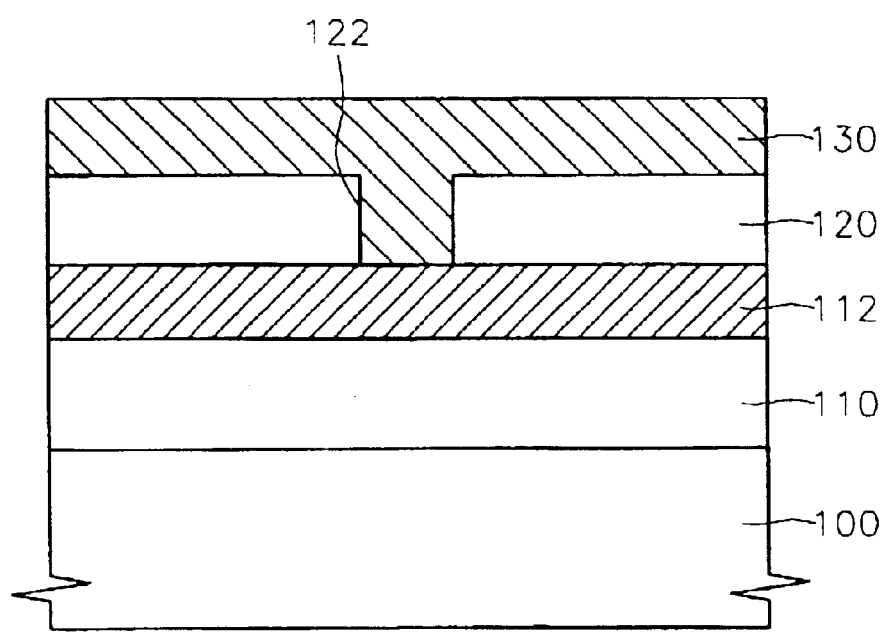

Referring to FIGS. 6A and 6B, a conductive material layer 130 can be deposited on the insulating layer 120 having the holes 122, 124, and 126 and the via hole 128 to provide upper wires. At the same time, the holes 122, 124, and 126 and the via hole 128 can be filled with the conductive material layer 130. In this case, the conductive material layer 130 can be deposited by a blanket deposition method.

Metal, such as tungsten, aluminum, and/or copper can be deposited on the entire surface of the insulating layer 120, as the conductive material layer 130. In this case, the metal can be deposited by CVD method and/or PVD techniques. Especially, in the case of depositing aluminum, a reflow process can be added to increase filling of the holes 122, 124, and 126 and the via hole 128. According to particular embodiments of the present invention, aluminum can be used as the lower wires 112, 114, and 116 and as the conductive material layer 130. Alternately, copper can be used thereby providing excellent conductivity.

Figure 7A:
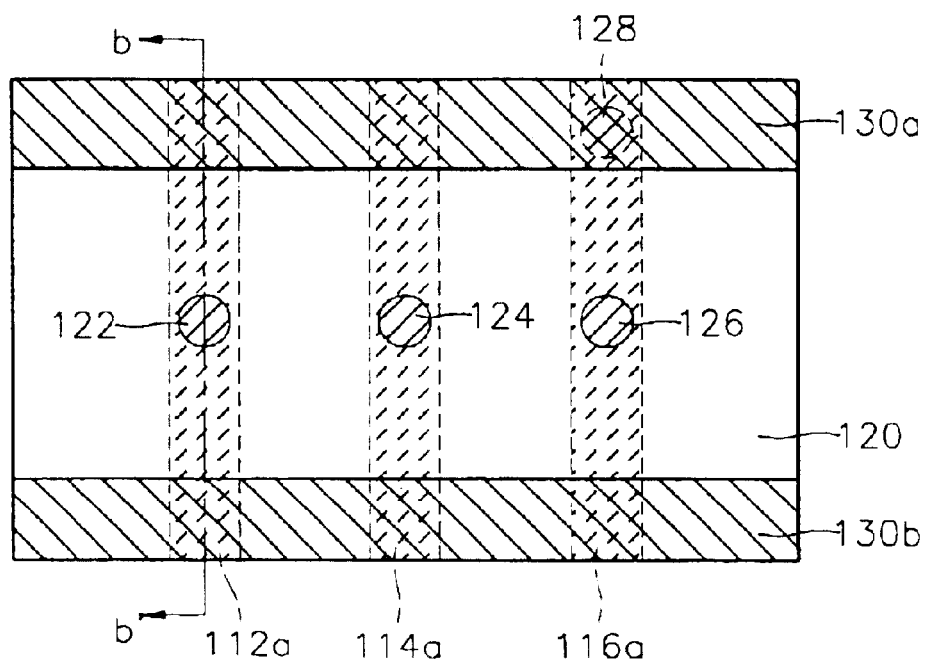
Figure 7B:
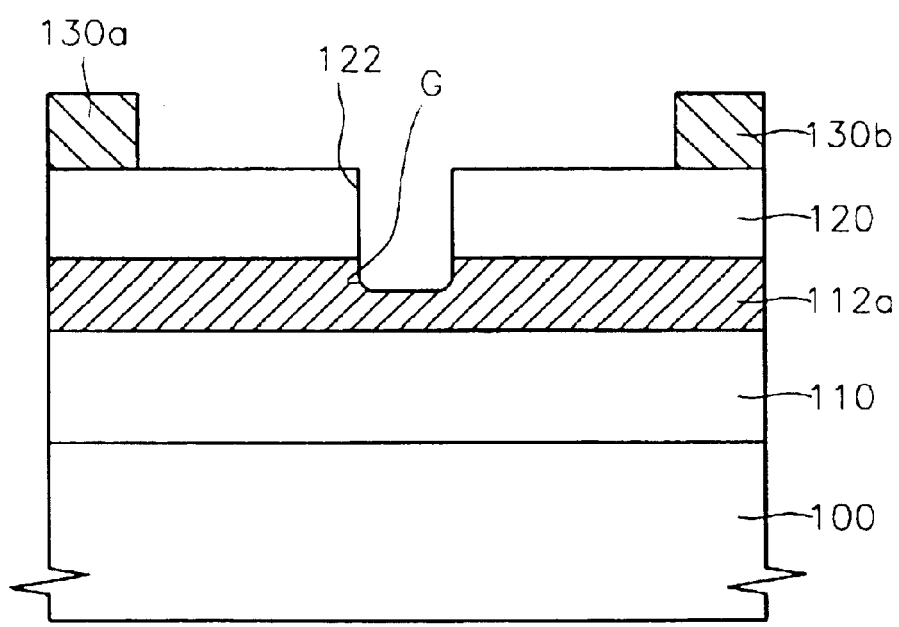
Figure 7C:
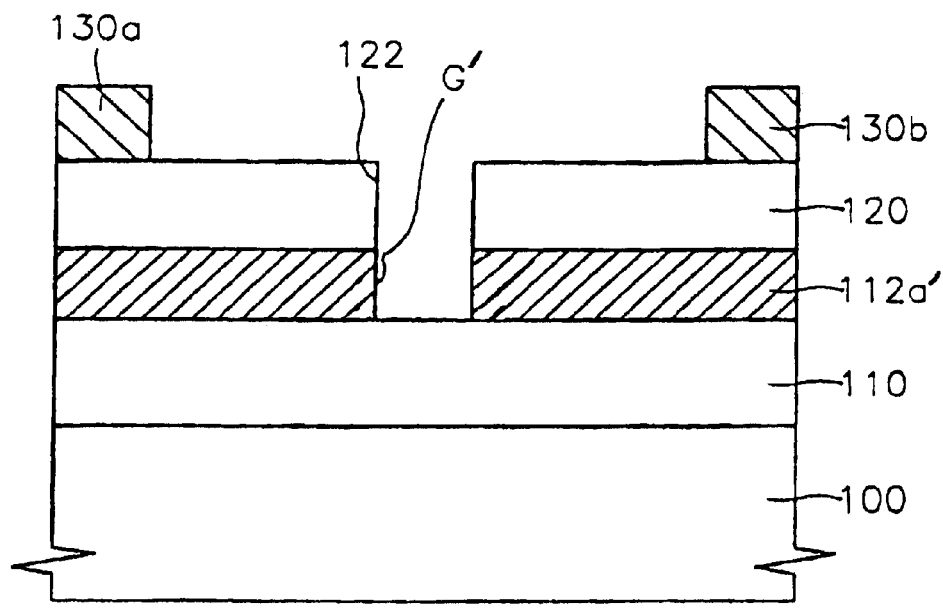

Referring to FIGS. 7A and 7B, upper wire 130a can be formed on a portion other than the laser target spots by patterning the conductive material layer 130 for connecting to the lower wire 116 through the conductive material layer 130 filled in the via hole 128. As shown in FIGS. 7A and 7B, another upper wire 130b can be formed to connect to a predetermined lower wire at a predetermined location. According to the desired design, the upper wires 130a and 130b may be realized in various shapes other than line shape. The shape other than the line shape will be described according to second embodiments of the present invention.

At the same time as forming the upper wires 130a and 130b, the conductive material layer 130 filled in the holes 122, 124, and 126 and the lower wires 112, 114, and 116 under the holes 122, 124, and 126 can be etched to form grooves G at the laser target spots. In this case, the grooves G can be etched in the shape of the preformed holes 122, 124, and 126. In FIG. 7B, the groove G is shown to be in a fuse 112a, but the depth of the grooves can be adjusted as desired. If needed, the grooves can be formed to penetrate the lower wires to expose the interlevel insulating layer 110. As shown in FIG. 7A, the grooves (G) (patterned through holes 122, 124, and 126) may penetrate lower wires 112, 114, and 116 while maintaining electrical continuity of lower wires 112, 114, and 116 around the grooves. In particular, edge portions of lower wires 112, 114, and 116 can be maintained around the grooves even when the grooves penetrate the respective lower wires exposing portions of the interlevel insulating layer 110 therebeneath. Accordingly, cross-sectional areas of the lower wires can be reduced at the laser target spots.

Operations of forming the upper wires 130a and 130b and the grooves G will be now discussed in greater detail. A photoresist mask (not shown) can be formed on the conductive material layer 130 used to form the upper wires 130a and 130b. Accordingly, only the portions of the layer used to form the upper wires 130a and 130b are covered by the photoresist mask. When the conductive material layer 130 is etched using the photoresist mask as an etch mask, portions of the conductive material layer 130 not covered by the photoresist mask are etched. At the same time, portions of the conductive material layer 130 filling in the holes 122, 124, and 126 can be etched away. By extending the etch time, the lower wires 112, 114, and 116 under the holes 122, 124, and 126 can be etched to form the grooves G. In etching the conductive material layer 130, a wet etching technique can be used. In the case of forming a highly integrated semiconductor device, an anisotropic dry etching technique in which the etching degree can be precisely controlled can be used. An etch gas can be provided by adding proper amounts of oxygen and argon to the gas including chlorine and fluorine, according to etch targets. In order to improve activation, plasma can be used.

According to the above-described processes, the fuses 112a, 114a, and 116a having the grooves G at the laser target spots can be formed. Since the cutting volume is reduced by forming the grooves G, the fuses 112a, 114a, and 116a can be successfully cut using laser irradiation with a relatively small amount of energy for a relatively short time. In addition, damage on the peripheral of the cut fuses 112a, 114a, and 116a can be reduced.

It may be desirable that an operation of forming a passivation layer on an entire surface of the substrate 100 including the upper wires 130a and 130b be added. An operation of forming the passivation layer may be the last operation in forming the chip. The passivation layer can be provided by a dielectric and/or buffering coating operation to reduce the scratching of the chip and/or penetration by moisture. It may be preferred that the passivation layer is formed of a silicon nitride layer, a silicon oxide layer, and/or a composite of the layers. The passivation layer can absorb mechanical, electrical, and/or chemical impacts applied to the lower structure in following assembly and packaging steps so as to protect the semiconductor elements.

According to first preferred embodiments of the present invention, the grooves can be formed on the lower wires to reduce the cutting volume, namely, portions of lower wire(s) to be cut by laser radiation. As a result, fuse cutting can be conveniently performed, and a success rate of fuse cutting can be improved even when using laser radiation with a relatively small amount of energy for a relatively short time. When using laser radiation to cut a selected fuse, damage to fuses adjacent the selected fuse can be reduced. Consequently, fuses can be packed for under a predetermined pitch, thereby increasing fuse density.

Figure 8:
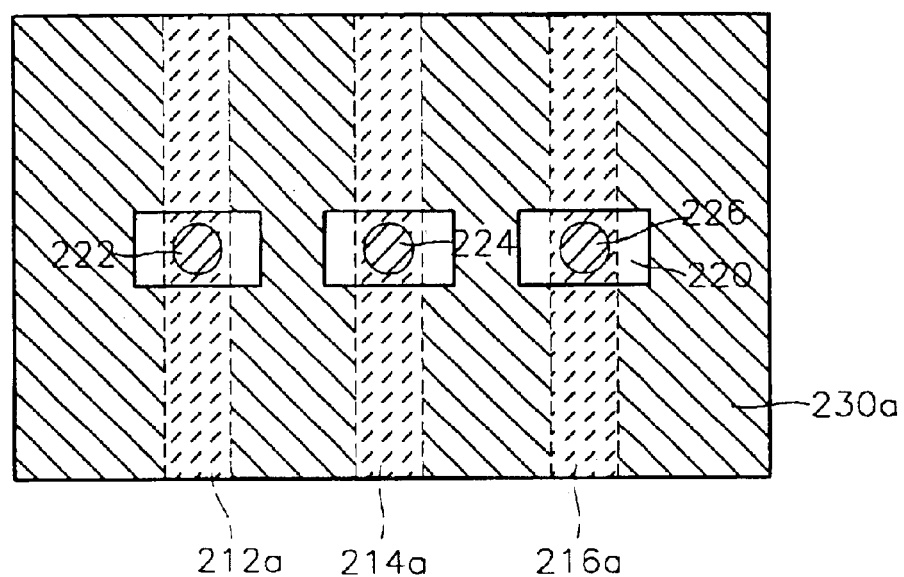
FIG. 8 illustrates steps of a method of forming fuses in a semiconductor device and related structures according to second embodiments of the present invention.

FIG. 8 illustrates operations of a method of forming fuses in a semiconductor device according to second embodiments of the present invention. As described in referring to FIGS. 7A and 7B, upper wires can be realized in various shapes according to intended design, other than line shape. In FIG. 8, an upper wire 230a can be formed on an entire surface of an insulating layer 220 except laser target spots. In this case, a conductive material layer in holes 222, 224, and 226 can be etched when patterning the upper wire 230a so that grooves are formed in fuses 212a, 214a, and 216a.

Figure 9:
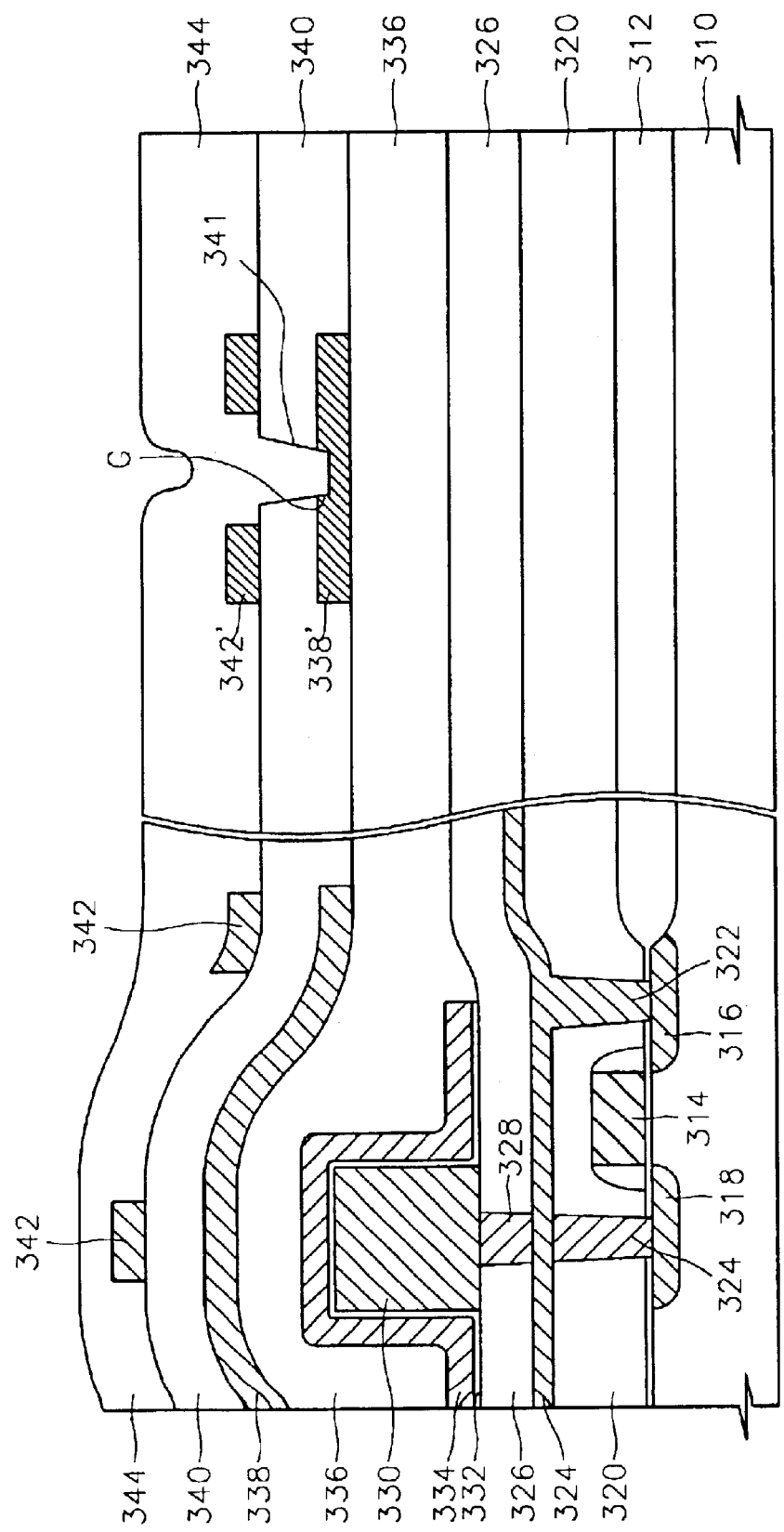
FIG. 9 illustrates steps of a method of forming fuses in a semiconductor device and related structures according to third embodiments of the present invention.

FIG. 9 illustrates methods of forming fuses in a semiconductor device according to third embodiments of the present invention. In FIG. 9, a DRAM device having a multilevel metal wire structure is described. The left half of FIG. 9 illustrates a cell array region, and the right half of FIG. 9 illustrates a fuse region. The fuses are simultaneously formed with the cell array region according to third preferred embodiments.

After forming an isolation layer 312 on a substrate 310, and forming a gate electrode 314, a source region 318, and a drain region 316 of a transistor, a first interlevel insulating layer 320 is formed on the entire surface of the substrate 310. A first interlevel insulating layer 320 is etched to form a contact hole through which the drain region 316 is exposed. Then, a conductive material such as doped polysilicon, silicide, and/or a stacked layer of polysilicon and silicide is deposited and patterned. As a result, a contact plug 322 and a bit line 324 can be formed.

A second interlevel insulating layer 326 is deposited on the entire surface of the substrate 310 including the bit line 324. Then, a second interlevel insulating layer 326 is etched to form a contact hole through which the source region 318 is exposed. After forming a contact plug 328 by depositing a conductive material (such as doped polysilicon) in the contact hole, a lower electrode 330 can be formed on the contact plug 328. While the lower electrode 330 is illustrated as a stack type electrode in FIG. 9, the lower electrode 330 can be formed in various shapes such as a cylinder or fin, and/or a hemispherical grain can be formed on the surface of the lower electrode 330. After forming a dielectric layer 332 on the entire surface of the lower electrode 330, a conductive material (such as doped polysilicon) can be deposited to form an upper electrode layer. Then, the upper electrode layer can be patterned so as to form an upper electrode 334. While the bit line 324 and the lower electrode contact plug 328 may appear to be located on an identical vertical section, this appearance is merely provided for a better understanding of the invention. Actually, the lower electrode contact plug 328 and the bit line 324 can be in different planes, and they do not contact each other.

A third interlevel insulating layer 336 can be formed on an upper electrode 334, and lower metal wires 338 and 338' can be formed on the third interlevel insulating layer. In this case, a metal, such as tungsten, aluminum, and/or copper, can be deposited on the entire surface of the third interlevel insulating layer 336 by a CVD or PVD method to be patterned in a desired wire pattern, thereby completing the lower metal wires 338 and 338'. The lower metal wire 338' can be used as a fuse.

An insulating layer 340 is formed on the substrate 310 including the lower metal wires 338 and 338'. In this case, the interlevel insulating layers 320, 326, and 336 and the insulating layer 340 can include one or more of BPSG, PSG, SOG, TEOS, and/or USG and/or combinations thereof. The insulating layer 340 can be etched to provide a hole 341 on the lower metal wire 338' centering upon a target spot on which a laser can cut the lower metal wire in a fuse cutting operation.

A conductive material layer used to form upper metal wires can be deposited on the insulating layer 340 having the hole 341. At the same time, the hole 341 can be filled with the conductive material layer, which can be formed of tungsten, aluminum, and/or copper. The conductive material layer can be patterned to form upper metal wires 342 and 342'. The upper metal wires 342 and 342' can be connected to the lower metal wires 338 and 338' through portions of the conductive material layer filling an optional via hole. In particular, the upper metal wire 342' can be formed on the portion other than the laser target spot. At the same time, the upper metal wires 342 and 342' are patterned, portions of the conductive material layer in the hole 341 and the lower metal wire 338' under the hole 341 can be etched to form a groove G at the portion to be the laser target spot. Because a cutting volume is reduced by forming the groove G, the lower metal wire 338' can be successfully cut using a relatively small amount of laser energy for a relatively short time. Moreover, damage on the peripheral of the lower metal wire 338' can be reduced.

A passivation layer 344 can be formed on the entire surface of the substrate 310 including the upper metal layers 342 and 342'. It may be preferable that the passivation layer 344 is formed of a silicon nitride layer, a silicon oxide layer, and/or a composite layer of a silicon nitride layer and/or a silicon oxide layer, which can resist moisture-seepage. The lower metal wire 338' being used as the fuse can be located relatively close to the topmost surface of the semiconductor device. Accordingly, an operation of forming a fuse opening portion by etching the passivation and insulating/interlevel insulating layers such as in the case of using the bit line or the word line as a fuse may not be required.

Figure 10:
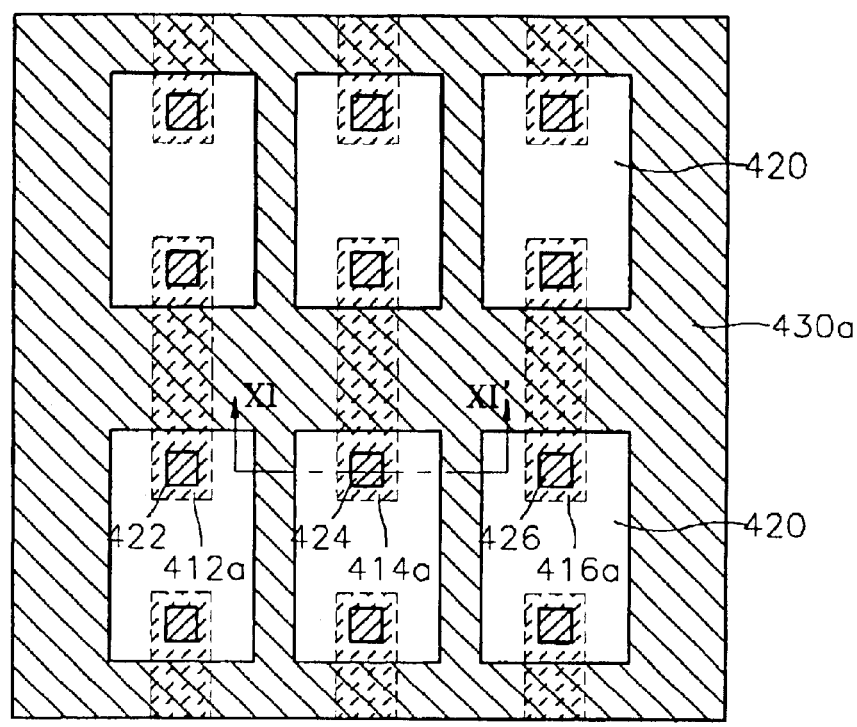
FIG. 10 is a plan view of a sample for examining microstructures of fuses according to embodiments of the present invention.

FIG. 10 is a plan view of a manufactured sample, provided to examine a microstructure of a fuse according to embodiments of the present invention. In FIG. 10, fuses 412a, 414a, and 416a have grooves; insulating layers 420 are provided on the fuses 412a, 414a, and 416a; and holes 422, 424, and 426 are provided through the insulating layers 420 exposing the grooves. An upper wire 430a is formed on the insulating layers 420. The sample can be produced according to embodiments of the present invention illustrated in FIGS. 4A–7B, with changes in shapes of the fuses 412a, 414a, and 416a, the holes 422, 424, and 426, and the upper wire 430a.

Figure 11:
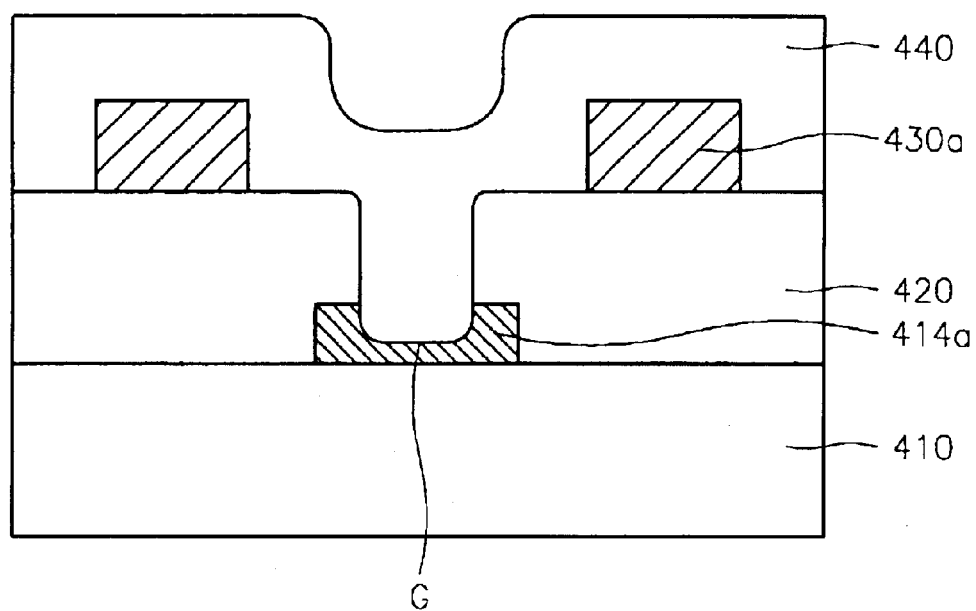
FIG. 11 is a sectional focused ion beam (FIB) view of the sample shown in FIG. 10.

FIG. 11 is schematic view illustrating a sectional focused ion beam (FIB) of the sample shown in FIG. 10, taken along cutting plane line XI–XI' shown in FIG. 10. Referring to FIG. 11, the fuse 414a formed on an interlevel insulating layer 410, the insulating layer 420 formed on the fuse 414a, the upper wire 430a formed on the insulating layer 420, and a passivation layer 440 coating the elements are shown. As shown in FIG. 11, a groove G can be successfully formed on a lower wire.

As discussed above, cutting volumes of lower wires, (namely portions to which laser radiation may be applied), can be reduced during fuse cutting operations. Accordingly, the lower wires can be successfully cut using laser radiation with a relatively small amount of energy for a relatively short time. As a result, fuses can be rapidly cut to improve productivity in mass production.

Methods of forming fuses in semiconductor devices and related structures according to embodiments of the present invention can reduce damage to fuses adjacent to a selected fuse when using laser radiation to cut the selected fuse. Methods and related structures according to embodiments of the present invention can also provide fuses in a denser pitch.

According to embodiments of the present invention, methods of forming fuses in a semiconductor device can include forming lower wires to be used as fuses on a substrate, and then forming an insulating layer on the substrate including the lower wires. Holes can be formed in the insulating layer through which portions of the lower wires can be exposed as laser target spots for subsequent fuse cutting operations. One or more via holes can also be formed in the insulating layer for electrical connection between the lower wires and upper wires to be formed on the insulating layer. The holes exposing target spots and the via holes can be formed using a common etching of the insulating layer. A conductive material layer can be deposited on the insulating layer having the target spot holes and the via holes, and the target spot holes and the via holes can be filled with the conductive material layer. The conductive material layer can then be patterned to provide upper wires on the insulating layer connected to respective lower wires through the conductive material layer in the via hole(s). The conductive material can be removed from the holes exposing the laser target spots. At the same time, portions of the conductive material layer filling in the holes exposing target spots of the lower wires and the target spots can be etched to form grooves at the target spots of the lower wires. By forming the grooves, a cutting volume of the lower wires, can be reduced during fuse cutting. Consequently, the lower wires can be successfully cut using laser radiation with a relatively small amount of energy and for a relatively short time. In addition, damage to peripheral portions of the cut lower wires can be reduced.

According to embodiments of the present invention, a success rate in cutting fuses can be improved. Stress applied to fuses adjacent to the cut fuse can be reduced so that damage on the adjacent fuses can also be reduced. Moreover, the fuses can be packed under a predetermined pitch to improve fuse density, i.e., the number of fuses within unit area can be increased.

Because laser radiation can be used with a relatively small amount of energy for a relatively short time, stress applied to the fuses adjacent to cut fuses can be reduced. Consequently, damage on the adjacent fuses can be reduced, and the fuses can be packed under a predetermined pitch, thereby locating a larger number of fuses in a limited area.

What is claimed is:

1. A method of forming an integrated circuit device, the method comprising:
   forming a plurality of fuse wires on an integrated circuit substrate;
   forming an insulating layer on the integrated circuit substrate and on the plurality of fuse wires so that the fuse wires are between the integrated circuit substrate and the insulating layer;
   forming a plurality of fuse cutting holes in the insulating layer wherein each of the fuse cutting holes exposes a target spot on a respective one of the fuse wires; and
   reducing cross-sectional areas of the fuse wires at the exposed target spots.

2. A method according to claim 1 wherein reducing cross-sectional areas comprises forming grooves in the exposed target spots of the fuse wires.

3. A method according to claim 1 wherein reducing cross-sectional areas comprises forming holes in the exposed target spots of the fuse wires.

4. A method according to claim 1 further comprising:
   after reducing cross-sectional areas, cutting one of the plurality of fuse wires at the exposed target spot of the fuse wire.

5. A method according to claim 4 wherein cutting one of the plurality of fuse wires is performed while maintaining continuity of others of the plurality of fuse wires.

6. A method according to claim 4 wherein cutting one of the plurality of fuse wires comprises laser cutting one of the plurality of fuse wires.

7. A method according to claim 1 wherein reducing cross-sectional areas is preceded by:
   forming connective wires on the insulating layer including the fuse cutting holes therein.

8. A method according to claim 7 wherein forming connective wires further comprises forming a conductive layer on the insulating layer and in the fuse cutting holes, and patterning the conductive layer to form the connective wires.

9. A method according to claim 8 wherein patterning the conductive layer comprises removing the conductive layer from within the fuse cutting holes.

10. A method according to claim 9 wherein patterning the conductive layer comprises etching the conductive layer and wherein forming grooves comprises continuing the etch used to pattern the conductive layer.

11. A method according to claim 7 further comprising:
forming a via hole in the insulating layer exposing a portion of one of the fuse wires wherein one of the connective wires is coupled with the fuse wire through the via hole.

12. A method according to claim 11 wherein the plurality of fuse cutting holes and the via hole are formed at the same time.

13. A method according to claim 7 further comprising:
forming a passivation layer on the insulating layer and on the connective wires so that the connective wires are between the insulating layer and the passivation layer.

14. A method according to claim 1 wherein the insulating layer comprises at least one material selected from the group consisting of boron phosphorous silicate glass (BPSG), phosphorous silicate glass (PSG), spin on glass (SOG), tetra ethyl ortho silicate (TEOS), undoped silicate glass (USG), and/or combinations thereof.

15. A method according to claim 1 wherein the fuse wires comprise metal.

16. A method according to claim 15 wherein the metal comprises at least one selected from the group consisting of tungsten, aluminum, and/or copper.

17. A method according to claim 1 wherein reducing cross-sectional areas of the fuse wires at the exposed target spots comprises reducing thicknesses of the exposed target spots while maintaining a thickness of portions of the fuse wires covered by the insulating layer.

18. A method according to claim 1 wherein reducing thicknesses of fuse wires at the exposed target spots comprises penetrating the exposed target spots thereby exposing portions of the substrate opposite the insulating layer.

19. A method according to claim 1 wherein forming a plurality of fuse wires is preceded by:
forming a gate insulating layer on a semiconductor substrate;
forming first and second source/drain regions in the semiconductor substrate on opposite sides of the gate insulating layer;
forming a gate electrode on the gate insulating layer; and
forming a interlayer insulating layer on the gate electrode, the first and second source/drain regions, and the semiconductor substrate.

20. An integrated circuit device comprising:
a plurality of fuse wires on an integrated circuit substrate; and
an insulating layer on the integrated circuit substrate and on the plurality of fuse wires so that the fuse wires are between the integrated circuit substrate and the insulating layer wherein the insulating layer includes a plurality of fuse cutting holes therein wherein each of the fuse cutting holes exposes a target spot on a respective one of the fuse wires;
wherein the fuse wires have reduced cross-sectional areas at the target spots exposed by the fuse cutting holes.

21. An integrated circuit device according to claim 20 wherein the reduced cross-sectional areas comprise grooves in the fuse wires at the exposed target spots.

22. An integrated circuit device according to claim 20 wherein the reduced cross-sectional areas comprises holes in the fuse wires at the exposed target spot.

23. An integrated circuit device according to claim 20 further comprising:
a plurality of connective wires on the insulating layer including the fuse cutting holes therein.

24. An integrated circuit device according to claim 23 wherein the insulating layer further includes a via hole therein exposing a portion of one of the fuse wires wherein one of the connective wires is coupled with the fuse wire through the via hole.

25. An integrated circuit device according to claim 23 further comprising:
a passivation layer on the insulating layer and on the plurality of connective wires so that the connective wires are between the insulating layer and the passivation layer.

26. An integrated circuit device according to claim 20 wherein the insulating layer comprises at least one material selected from the group consisting of boron phosphorous silicate glass (BPSG), phosphorous silicate glass (PSG), spin on glass (SOG), tetra ethyl ortho silicate (TEOS), undoped silicate glass (USG), and/or combinations thereof.

27. An integrated circuit device according to claim 20 wherein the fuse wires comprise metal.

28. An integrated circuit device according to claim 27 wherein the metal comprises at least one selected from the group consisting of tungsten, aluminum, and/or copper.

29. An integrated circuit device according to claim 20 wherein portions of the fuses wires having the reduced cross-sectional areas have reduced thicknesses at the exposed target spots and wherein portions of the fuse wires covered by the insulating layer have an increased thickness with respect to the reduced thickness.

30. An integrated circuit device according to claim 20 wherein portions of the fuse wires having the reduced cross-sectional areas comprises hole penetrating the exposed target spots thereby exposing portions of the substrate opposite the insulating layer.

31. An integrated circuit device according to claim 20 wherein the integrated circuit substrate includes
a gate insulating layer on a semiconductor substrate,
first and second source/drain regions in the semiconductor substrate on opposite sides of the gate insulating layer,
a gate electrode on the gate insulating layer, and
a interlayer insulating layer on the gate electrode, the first and second source/drain regions, and the semiconductor substrate such that the plurality of fuse wires are on the interlayer insulating layer opposite the semiconductor substrate.

32. A method of forming fuses in a semiconductor device, the method comprising:
forming lower wires on a substrate for being used as fuses;
forming an insulating layer on the substrate including the lower wires;
etching the insulating layer for forming holes through which portions of the lower wires to be laser target spots in a fuse cutting process are partially exposed and a via hole for electrically connecting the lower wires and upper wires to be formed on the insulating layer;
filling the holes and the via hole by a conductive material layer to be the upper wires, while depositing the conductive material layer on the insulating layer having the holes and the via hole; and
forming the upper wires on regions other than the laser target spots for being connected to the lower wires via the conductive material layer filled in the via hole by patterning the conductive material layer, and simultaneously forming grooves at the laser target spots by etching the conductive material layer filled in the holes and the lower wires under the holes so that the lower wires are successfully cut even by irradiating laser with a small amount of energy for a short time and damage on the cut lower wires and the peripheral is minimized.

33. The method of forming fuses in a semiconductor device of claim 32, further comprising forming an interlevel insulating layer on the substrate before forming the lower wires.

34. The method of forming fuses in a semiconductor device of claim 33, wherein
the interlevel insulating layer is formed of boron phosphorous silicate glass (BPSG), phosphorous silicate glass (PSG), spin on glass (SOG), tetra ethyl ortho silicate (TEOS), undoped silicate glass (USG), or combinations thereof.

35. The method of forming fuses in a semiconductor device of claim 32, wherein
the insulating layer is formed of BPSG, PSG, SOG, TEOS, USG, or combinations thereof.

36. The method of forming fuses in a semiconductor device of claim 32, wherein
etching the insulating layer is performed after deciding the shape, number, and layout of holes and via hole in considering the pitch, structure, and layout of the lower wires.

37. The method of forming fuses in a semiconductor device of claim 32, wherein the lower wires and the conductive material layer are formed of metal.

38. The method of forming fuses in a semiconductor device of claim 37, wherein the metal is tungsten, aluminum, or copper.

39. The method of forming fuses in a semiconductor device of claim 37, wherein the metal is formed by a chemical vapor deposition (CVD) method or a physical vapor deposition (PVD) method.

40. The method of forming fuses in a semiconductor device of claim 32, wherein depth of the grooves can be adjusted if needed.

41. The method of forming fuses in a semiconductor device of claim 32, wherein the grooves are formed to penetrate the lower wires.

42. The method of forming fuses in a semiconductor device of claim 32, further comprising forming a passivation layer on the entire surface of the substrate including the upper wires.

43. The method of forming fuses in a semiconductor device of claim 42, wherein the passivation layer is formed of one of a silicon nitride layer, a silicon oxide layer, and a composite layer of a silicon nitride layer and a silicon oxide layer.

44. The method of forming fuses in a semiconductor device of claim 32, wherein the semiconductor device is a DRAM device having multilevel metal wires, and the lower and upper wires are the multilevel metal wires in the semiconductor device.

* * * * *

UNITED STATES PATENT AND TRADEMARK OFFICE
CERTIFICATE OF CORRECTION

PATENT NO.    : 6,878,614 B2
DATED         : April 12, 2005
INVENTOR(S)   : Sun et al.

It is certified that error appears in the above-identified patent and that said Letters Patent is hereby corrected as shown below:

<u>Columns 8-12,</u>
The claims should read as follows:

1. A method of forming an integrated circuit device, the method comprising:
forming a plurality of fuse wires on an integrated circuit substrate;
forming an insulating layer on the integrated circuit substrate and on the plurality of fuse wires so that the fuse wires are between the integrated circuit substrate and the insulating layer;
forming a plurality of fuse cutting holes in the insulating layer wherein each of the fuse cutting holes exposes a target spot on a respective one of the fuse wires; and
after forming the plurality of fuse cutting holes in the insulating layer, reducing cross-sectional areas of the fuse wires at the target spots exposed through the fuse cutting holes.

2. A method according to Claim 1 wherein reducing cross-sectional areas comprises forming grooves in the exposed target spots of the fuse wires.

3. A method according to Claim 1 wherein reducing cross-sectional areas comprises forming holes in the exposed target spots of the fuse wires.

4. A method according to Claim 1 further comprising:
after reducing cross-sectional areas, cutting one of the plurality of fuse wires at the exposed target spot of the fuse wire.

5. A method according to Claim 4 wherein cutting one of the plurality of fuse wires is performed while maintaining continuity of others of the plurality of fuse wires.

6. A method according to Claim 4 wherein cutting one of the plurality of fuse wires comprises laser cutting one of the plurality of fuse wires.

7. A method of forming an integrated circuit device, the method comprising:
forming a plurality of fuse wires on an integrated circuit substrate;
forming an insulating layer on the integrated circuit substrate and on the plurality of fuse wires so that the fuse wires are between the integrated circuit substrate and the insulating layer;
forming a plurality of fuse cutting holes in the insulating layer wherein each of the fuse cutting holes exposes a target spot on a respective one of the fuse wires; and
forming connective wires on the insulating layer including the fuse cutting holes therein; and
after forming connective wires on the insulating layer, reducing cross-sectional areas of the fuse wires at the exposed target spots.

8. A method according to Claim 7 wherein forming connective wires further comprises forming a conductive layer on the insulating layer and in the fuse cutting holes, and patterning the conductive layer to form the connective wires.

9. A method according to Claim 8 wherein patterning the conductive layer comprises removing the conductive layer from within the fuse cutting holes.

UNITED STATES PATENT AND TRADEMARK OFFICE
CERTIFICATE OF CORRECTION

PATENT NO. : 6,878,614 B2
DATED : April 12, 2005
INVENTOR(S) : Sun et al.

It is certified that error appears in the above-identified patent and that said Letters Patent is hereby corrected as shown below:

Columns 8-12 (cont'd),

10. A method according to Claim 9 wherein patterning the conductive layer comprises etching the conductive layer and wherein forming grooves comprises continuing the etch used to pattern the conductive layer.

11. A method according to Claim 7 further comprising:
forming a via hole in the insulating layer exposing a portion of one of the fuse wires wherein one of the connective wires is coupled with the fuse wire through the via hole.

12. A method according to Claim 11 wherein the plurality of fuse cutting holes and the via hole are formed at the same time.

13. A method according to Claim 7 further comprising:
forming a passivation layer on the insulating layer and on the connective wires so that the connective wires are between the insulating layer and the passivation layer.

14. A method according to Claim 1 wherein the insulating layer comprises at least one material selected from the group consisting of boron phosphorous silicate glass (BPSG), phosphorous silicate glass (PSG), spin on glass (SOG), tetra ethyl ortho silicate (TEOS), undoped silicate glass (USG), and/or combinations thereof.

15. A method according to Claim 1 wherein the fuse wires comprise metal.

16. A method according to Claim 15 wherein the metal comprises at least one selected from the group consisting of tungsten, aluminum, and/or copper.

17. A method according to Claim 1 wherein reducing cross-sectional areas of the fuse wires at the exposed target spots comprises reducing thicknesses of the exposed target spots while maintaining a thickness of portions of the fuse wires covered by the insulating layer.

18. A method according to Claim 1 wherein reducing cross-sectional areas of fuse wires at the exposed target spots comprises penetrating the exposed target spots thereby exposing portions of the substrate opposite the insulating layer.

19. A method according to Claim 1 wherein forming a plurality of fuse wires is preceded by:
forming a gate insulating layer on a semiconductor substrate;
forming first and second source/drain regions in the semiconductor substrate on opposite sides of the gate insulating layer;
forming a gate electrode on the gate insulating layer; and
forming a interlayer insulating layer on the gate electrode, the first and second source/drain regions, and the semiconductor substrate.

20. An integrated circuit device comprising:
a plurality of fuse wires on an integrated circuit substrate;
an insulating layer on the integrated circuit substrate and on the plurality of fuse wires so that the fuse wires are between the integrated circuit substrate and the insulating layer wherein the insulating layer includes a plurality of fuse cutting holes therein wherein each of the fuse cutting holes exposes a target spot on a respective one of the fuse wires wherein the fuse wires have reduced cross-sectional areas at the target spots exposed by the fuse cutting holes; and
a plurality of connective wires on the insulating layer including the fuse cutting holes therein.

21. An integrated circuit device according to Claim 20 wherein the insulating layer further includes a via hole therein exposing a portion of one of the fuse wires wherein one of the connective wires is coupled with the fuse wire through the via hole.

22. An integrated circuit device according to Claim 20 further comprising:
a passivation layer on the insulating layer and on the plurality of connective wires so that the connective wires are between the insulating layer and the passivation layer.

UNITED STATES PATENT AND TRADEMARK OFFICE
CERTIFICATE OF CORRECTION

PATENT NO. : 6,878,614 B2
DATED : April 12, 2005
INVENTOR(S) : Sun et al.

It is certified that error appears in the above-identified patent and that said Letters Patent is hereby corrected as shown below:

Columns 8-12 (cont'd),

23. An integrated circuit device comprising:
a plurality of fuse wires on an integrated circuit substrate; and
an insulating layer on the integrated circuit substrate and on the plurality of fuse wires so that the fuse wires are between the integrated circuit substrate and the insulating layer wherein the insulating layer includes a plurality of fuse cutting holes therein wherein each of the fuse cutting holes exposes a target spot on a respective one of the fuse wires wherein the fuse wires have reduced cross-sectional areas at the target spots exposed by the fuse cutting holes; and
wherein the insulating layer comprises at least one material selected from the group consisting of boron phosphorous silicate glass (BPSG), phosphorous silicate glass (PSG), spin on glass (SOG), tetra ethyl ortho silicate (TEOS), undoped silicate glass (USG), and/or combinations thereof.

24. An integrated circuit device according to Claim 20 wherein the fuse wires comprise metal.

25. An integrated circuit device according to Claim 24 wherein the metal comprises at least one selected from the group consisting of tungsten, aluminum, and/or copper.

26. An integrated circuit device according to Claim 20 wherein portions of the fuses wires having the reduced cross-sectional areas have reduced thicknesses at the exposed target spots and wherein portions of the fuse wires covered by the insulating layer have an increased thickness with respect to the reduced thickness.

27. An integrated circuit device according to Claim 20 wherein portions of the fuse wires having the reduced cross-sectional areas comprises holes penetrating the exposed target spots thereby exposing portions of the substrate opposite the insulating layer.

28. An integrated circuit device according to Claim 20 wherein the integrated circuit substrate includes a gate insulating layer on a semiconductor substrate,
first and second source/drain regions in the semiconductor substrate on opposite sides of the gate insulating layer,
a gate electrode on the gate insulating layer, and
a interlayer insulating layer on the gate electrode, the first and second source/drain regions, and the semiconductor substrate such that the plurality of fuse wires are on the interlayer insulating layer opposite the semiconductor substrate.

29. A method of forming fuses in a semiconductor device, the method comprising:
　forming lower wires on a substrate for being used as fuses;
　forming an insulating layer on the substrate including the lower wires;
　etching the insulating layer for forming holes through which portions of the lower wires to be laser target spots in a fuse cutting process are partially exposed and a via hole for electrically connecting the lower wires and upper wires to be formed on the insulating layer;
　filling the holes and the via hole by a conductive material layer to be the upper wires, while depositing the conductive material layer on the insulating layer having the holes and the via hole; and
　forming the upper wires on regions other than the laser target spots for being connected to the lower wires via the conductive material layer filled in the via hole by patterning the conductive material layer, and simultaneously forming grooves at the laser target spots by etching the conductive material layer filled in the holes and the lower wires under the holes so that the lower wires are successfully cut even by irradiating laser with a small amount of energy for a short time and damage on the cut lower wires and the peripheral is minimized.

30. The method of forming fuses in a semiconductor device of claim 29, further comprising forming an interlevel insulating layer on the substrate before forming the lower wires.

31. The method of forming fuses in a semiconductor device of claim 30, wherein
　the interlevel insulating layer is formed of boron phosphorous silicate glass (BPSG), phosphorous silicate glass (PSG), spin on glass (SOG), tetra ethyl ortho silicate (TEOS), undoped silicate glass (USG), or combinations thereof.

UNITED STATES PATENT AND TRADEMARK OFFICE
CERTIFICATE OF CORRECTION

PATENT NO. : 6,878,614 B2
DATED : April 12, 2005
INVENTOR(S) : Sun et al.

It is certified that error appears in the above-identified patent and that said Letters Patent is hereby corrected as shown below:

Columns 8-12 (cont'd),

32. The method of forming fuses in a semiconductor device of claim 29, wherein the insulating layer is formed of BPSG, PSG, SOG, TEOS, USG, or combinations thereof.

33. The method of forming fuses in a semiconductor device of claim 29, wherein etching the insulating layer is performed after deciding the shape, number, and layout of holes and via hole in considering the pitch, structure, and layout of the lower wires.

34. The method of forming fuses in a semiconductor device of claim 29, wherein the lower wires and the conductive material layer are formed of metal.

35. The method of forming fuses in a semiconductor device of claim 34, wherein the metal is tungsten, aluminum, or copper.

36. The method of forming fuses in a semiconductor device of claim 34, wherein the metal is formed by a chemical vapor deposition (CVD) method or a physical vapor deposition (PVD) method.

37. The method of forming fuses in a semiconductor device of claim 29, wherein depth of the grooves can be adjusted if needed.

38. The method of forming fuses in a semiconductor device of claim 29, wherein the grooves are formed to penetrate the lower wires.

39. The method of forming fuses in a semiconductor device of claim 29, further comprising forming a passivation layer on the entire surface of the substrate including the upper wires.

40. The method of forming fuses in a semiconductor device of claim 39, wherein the passivation layer is formed of one of a silicon nitride layer, a silicon oxide layer, and a composite layer of a silicon nitride layer and a silicon oxide layer.

41. The method of forming fuses in a semiconductor device of claim 29, wherein the semiconductor device is a DRAM device having multilevel metal wires, and the lower and upper wires are the multilevel metal wires in the semiconductor device.

Signed and Sealed this

Twenty-third Day of August, 2005

JON W. DUDAS
*Director of the United States Patent and Trademark Office*